United States Patent [19]

Arnett

[11] Patent Number: 4,684,544
[45] Date of Patent: Aug. 4, 1987

[54] SOLDER FLUXING METHOD AND APPARATUS

[75] Inventor: Richard K. Arnett, Kokomo, Ind.

[73] Assignee: General Motors Corporation, Detroit, Mich.

[21] Appl. No.: 830,727

[22] Filed: Feb. 19, 1986

[51] Int. Cl.$^4$ .............................................. H05K 3/22
[52] U.S. Cl. ...................................... 427/96; 228/31; 228/37; 228/207; 118/74; 427/310
[58] Field of Search .......................... 228/37, 31, 207; 427/310, 96; 118/74

[56] References Cited

U.S. PATENT DOCUMENTS

| | | | |
|---|---|---|---|
| 3,135,630 | 6/1964 | Bielinski | 228/37 |
| 3,216,643 | 11/1965 | De Vorter | 228/37 |
| 3,218,193 | 11/1965 | Isaacson | 427/310 |
| 3,589,590 | 6/1971 | Fitzsimmons | 228/37 |
| 4,009,816 | 3/1977 | Feuchtbaum | 427/310 |
| 4,158,076 | 6/1979 | Wallsten | 228/37 |
| 4,162,034 | 7/1979 | Paulas | 228/37 |

Primary Examiner—John D. Smith
Attorney, Agent, or Firm—Robert J. Wallace

[57] ABSTRACT

Solder flux is applied to the face of a printed circuit board (24) or the like by flowing a foam (30) of liquid flux bubbles upwardly through the top of a chimney flue (10) and into contact with the board face which is top passed over the top of the flue. The size of bubbles adjacent the face of the board is controlled by placing a grid screen (26) within and immediately beneath the top of the flue. The openings (26a) in the grid screen allow passage therethrough of smaller bubbles (34) but prevent passage of larger bubbles (32). The force of the board face on the foam urges the larger bubbles downwardly into contact with the grid screen where the grid wires of the screen pierce and thereby break the larger bubbles into smaller bubbles which then rise to the face of the board.

13 Claims, 4 Drawing Figures

SOLDER FLUXING METHOD AND APPARATUS

TECHNICAL FIELD

The present invention broadly relates to systems for applying liquid soldering flux to an electrical assembly, such as a printed circuit board, wherein the flux is applied by bringing the board into intimate contact with a foam of flux bubbles. More particularly, the present invention deals with an improved solder fluxing method and apparatus in which the size of the bubbles which come into contact with the board is controlled through the use of a grid screen.

BACKGROUND ART

Soldering flux is normally applied to electrical assemblies, such as printed circuit boards, before they are soldered in order to clean the electrical conductors and improve solder flow. In a high production environment, the printed circuit boards (PCB's) are passed over a foam of liquid flux bubbles which rise through the top of a chimney flue as overflowing foam. The face of the PCB is passed through and into intimate contact with the overflowing foam. The size of the foam bubbles determines, to a large extent, whether the proper amount of flux is applied to the PCB. If either too much or not enough flux is applied to the PCB, the quality of resulting solder joints may be affected.

It is believed that as a result of surface tension and on the overflowing foam, the rising bubbles in the foam have a tendency to combine into larger bubbles at the face of the PCB. the downwardly exerted pressure of the PCB. Inasmuch as there is more air in the larger bubbles, they tend to burst more readily, causing uneven covering of flux on the PCB. Uneven flux covering, in turn, results in incomplete soldering or excessive "solder voids". These solder voids must be filled by hand soldering techniques after the PCB is removed from the automatic soldering line or "solderpot".

It would therefore be desirable to eliminate the presence of large flux bubbles at the face of the PCB in order to avoid excessive solder voids. The present invention is directed toward achieving this objective.

SUMMARY OF THE INVENTION

According to the present invention, an improved, device-implemented method is provided for applying liquid solder flux to the face of a PCB or the like. A foam of liquid flux bubbles is generated within an upstanding chimney flue. The foam flows upwardly through the flue and overflows through the top thereof so as to present a layer of foam for intimately contacting the face of a PCB which is passed over the top of the flue. One aspect of the invention resides in recognition of the fact that flux coverage of the PCB depends in part on the size of the flux bubbles which contact the face of the PCB and that bubbles larger than a certain size result in poor flux coverage and solder voids on the PCB. In order to control bubble size, a grid screen is mounted within and extends across the flue, immediately below the top of the flue. The grid screen possesses a multiplicity of openings which are dimensioned so as to allow passage therethrough of flux bubbles of a preselected size, such as those rising through the flue. The grid screen is preferably formed of orthogonal sets of stainless steel wires which are spaced apart to form a 1/32 inch grid. In a preferred embodiment, the grid screen is spaced below the top of the flue approximately 1/4 to 1/2 inches. The downwardly acting force of the PCB on the foam forces larger bubbles downwardly into contact with the grid screen. The openings in the grid screen are too small to allow passage of these larger bubbles, consequently the wires of the screen pierce and thereby break the larger bubbles into smaller bubbles which then rise from the screen to the face of the PCB.

It is therefore a primary object of the present invention to provide an improved solder fluxing method and apparatus which provides for exceptionally even covering of flux on a circuit assembly to be soldered, such as a printed circuit board, and thereby reducing solder voids.

Another object of the invention is to provide an improved solder fluxing method and apparatus as described above which employs a foam of solder fluxing bubbles to coat the face of the PCB, and wherein the size of the bubbles which contact the PCB is controlled such that larger bubbles are eliminated.

A still further object of the invention is to provide an improved solder fluxing method and apparatus as described above in which the larger bubbles are converted into smaller bubbles by means of a grid screen which is disposed immediately beneath the face of the PCB.

These, and further objects of the invention, will be made clear, or will become apparent during the course of the following description of a preferred embodiment of the invention.

BRIEF DESCRIPTION OF THE DRAWINGS

In the drawings, which form an integral part of the specification and are to be read in conjunction therewith, and in which like reference numerals are employed to designate identical components in the various views.

DESCRIPTION OF THE PREFERRED EMBODIMENTS

Figure 1:
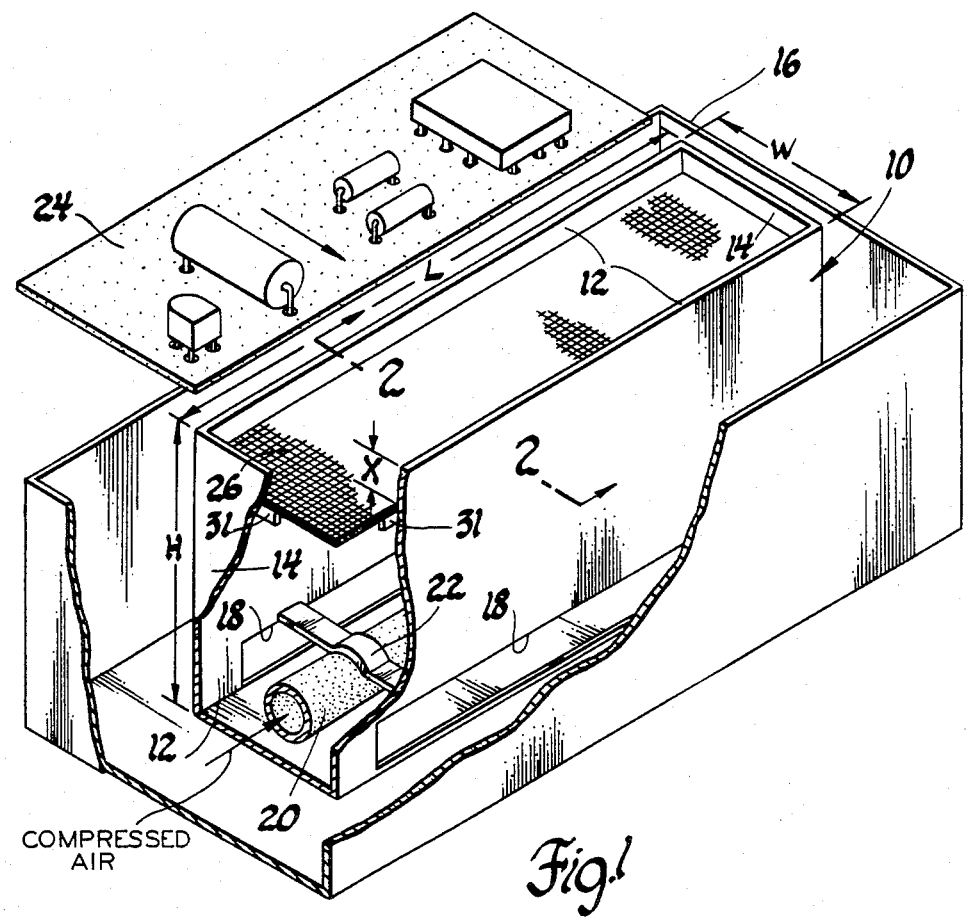
FIG. 1 is a perspective view of apparatus for applying solder flux to a PCB and employing the improvement of the present invention, parts being broken away and the liquid flux having been removed for purposes of clarity.
Figure 2:
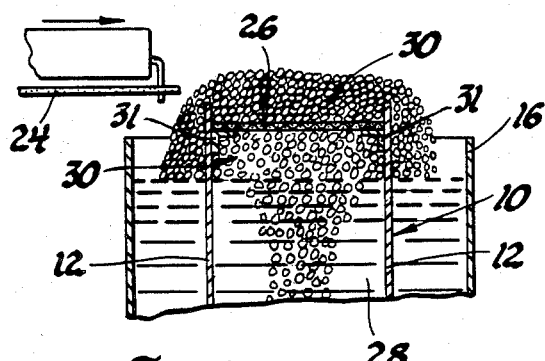
FIG. 2 is a sectional view taken along the line 2—2 in FIG. 1, but with the chimney flue shown filled with liquid solder flux.

Referring first to FIGS. 1 and 2, the present invention broadly relates to an improved solder fluxing method and apparatus in which a face of an electronic assembly, such as the PCB 24, is intimately contacted with liquid soldering flux in the form a foam 30 of solder flux bubbles. An outer rectangular container 16 is adapted to hold a quantity of liquid flux. Within the container 16, there is provided an upstanding chimney flue, generally indicated by the numeral 10, which includes a pair of parallel side walls 12 and parallel end walls 14. The bottom of the side walls 12 may have openings 18 therein to allow the liquid flux in the container 16 to enter the bottom of the chimney flue 10. As best seen in FIG. 2, the walls 12, 14 of the flue 10 extend slightly above those of the container 16. The dimensions of the flue 10 will vary depending upon the particular application and the size of the PCB 24 to be fluxed, however for illustrative purposes, the height, length and width, respectively designated by the letters H, L and W, of one successfully tested embodiment employing the improvement of the present invention are as follows: H=10 inches, L=10 inches, W=2 inches.

A conventional "airstone" 20 is mounted within the flue 10, near the bottom thereof, by means of a bracket 22 secured to the side walls 12. The airstone 20 comprises a foraminous hollow tube which extends essentially the entire length of the flue 10 and is adapted to be coupled with a source of compressed air. Air flowing into the airstone 20 emanates through the foraminous side wall thereof so as to aerate the liquid flux within the flue. That is to say, the airstone 20 continuously introduces a larger number of small air bubbles into the liquid flux, which, as best seen in FIG. 2, rise to the surface of the flux 28 within the flue 10. These rising air bubbles break the surface of the flux 28 and create a foam 30 of liquid flux bubbles. The foam 30 continues to flow upwardly through the flue 10 and over the top thereof in a waterfall fashion.

Figure 3:
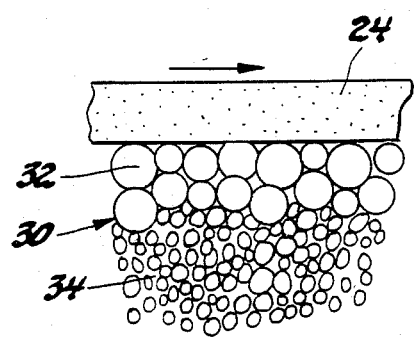
FIG. 3 is an enlarged, fragmentary view of the intimate contact between a face of the PCB and flux bubbles using a prior art fluxing method.

The apparatus thus far described is of a conventional nature of the type commonly employed in the past to flux printed circuit boards. As shown in FIG. 3, the apparatus thus far described results in a foam 30 of small bubbles 34 which have a tendency to combine into larger bubbles 32 at the bottom or contacted face of the PCB 24. It is believed that the tendency of the bubbles 34 to combine is a result of the downward pressure exerted by the PCB 24 as well as the surface tension of the bubbles. In any event, the larger bubbles 32 burst upon contact with the PCB 24 and result in uneven covering of flux on the PCB 24. The present invention involves recognition that the larger bubbles 32 at the face of the PCB 24 are undesirable and may be converted to smaller bubbles 34 by employing a grid screen 26.

Figure 4:
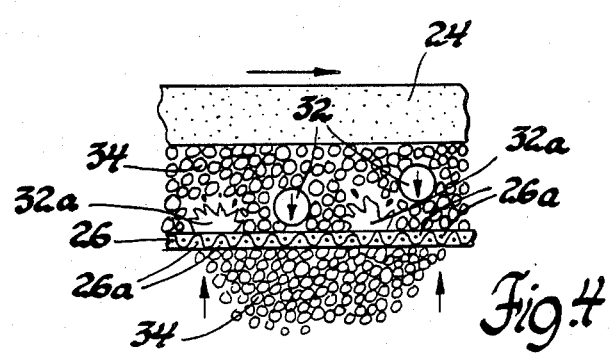
FIG. 4 is a view similar to FIG. 3 but showing the improvement of the present invention.

The grid screen 26 is formed by mutually orthogonal sets of wires, of a suitable corrosion resistant metal, such as stainless steel. The openings 26a formed by the grid wires should be wide enough to allow the smaller bubbles 34 to rise therethrough but, as shown in FIG. 4, such openings should be small enough to prevent the passage of the larger bubbles 32. In one successfully tested embodiment, it was found that a grid-size opening of 1/32 of an inch provided exceptionally satisfactory results. It was further found that the grid screen 26 should be preferably positioned beneath the top of the flue 10 a distance "X" (FIG. 1) approximately between ¼ and ½ inch. This latter-mentioned dimension will vary, however, depending upon the overall size of the flue 10, the size of the bubbles 34 and the size of the openings 26a in the grid screen 26. The distance "X" may be determined experimentally by positioning the grid screen 26 at successively higher locations in the flue 10 until the screen 26 has the effect of converting the bubbles into liquid, and then lowering the screen approximately ¼ inch within the flue 10.

As best seen in FIGS. 1 and 2, the grid screen 26 extends over the entire cross-section of the flue 10 and may be mounted to the walls 12, 14 of the flue 10 by any suitable means such as brackets 31.

Referring now particularly to FIGS. 2 and 4, the upwardly rising bubbles 34 pass through the openings 26a in the grid screen 26 and accumulate as foam 30 between the grid screen 26 and the PCB 24. The smaller bubbles 34 combine into larger bubbles 32, however these larger bubbles 32 are forced downwardly by the force of the PCB 24 which tends to compress the foam somewhat as it is passed over the flue 10. The larger bubbles 32 are forced into contact with the wire elements of the grid screen 26; since the openings 26a are too narrow to allow passage of the larger bubbles 32, the latter burst as at 32a and are thus converted into smaller bubbles which then rise to the face of the PCB 24. Although not shown in the illustrated embodiment, the PCB 24 is typically transported across the top of the flue 10 by means of a pallet which forms a leading edge that initially contacts the foam 30. It is this leading edge of the pallet which will normally initially compact the foam 30 and result in the bursting of the larger bubbles 32 before the PCB 24 traverses the top of the flue 10.

Having thus described the invention, it is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. Improved apparatus for applying soldering flux to the face of a printed circuit board or the like, and of the type including the combination of an upstanding flue over which the face of said board may be positioned to be contacted with flux, a supply of liquid flux within said flue, and means for generating an ascending foam of flux bubbles which rise upwardly through the top of said flue and into contact with the face of said board, the upwardly rising bubbles adjacent the face of said board having a tendency to combine into large bubbles, the improvement comprising: means extending substantially across said flue and adjacent said flue top for converting said larger bubbles into smaller bubbles.

2. The improvement of claim 1, wherein said converting means includes a wire grid defining openings through which said smaller bubbles may pass but preventing passage therethrough of said larger bubbles.

3. The improvement of claim 2, wherein said openings are approximately 1/32 of an inch wide.

4. The improvement of claim 2, wherein said wire grid is formed of stainless steel.

5. The improvement of claim 1, wherein said converting means includes an essentially planar member having a multiplicity of openings therein, said openings being smaller in width than said larger bubbles, whereby said larger bubbles are broken into smaller bubbles when said larger bubbles are forced through said planar member.

6. The improvement of claim 1, wherein:
said converting means includes a grid of matually orthogonal wires defining a screen having a multiplicity of openings, the size of said openings being such that said smaller bubbles may pass therethrough but preventing the passage therethrough of said larger bubbles, and
said screen extends essentially parallel to said face of said board and is spaced immediately below the top of said flue.

7. The improvement of claim 6, wherein said screen is spaced below the top of said flue between approximately ¼ and ½ inches.

8. Improved apparatus for applying soldering flux to the face of a printed circuit board or the like, and of the type including the combination of an upstanding flue over the top of which the board face is passed so as to be coated with flux, and means for generating an ascending foam of liquid flux bubbles within said flue which rise through the top of said flue and into contact with said board face, the improvement comprising:

a grid extending across said flue, said grid defining openings through which smaller bubbles of less than a certain size may pass but preventing passage therethrough of larger bubbles greater than said certain size, said grid being disposed within and spaced below the top of said flue such that the force of said board face on said foam urges said larger bubbles downwardly into contact with said grid whereby said grid breaks said larger bubbles into said smaller bubbles.

9. The improvement of claim 8, wherein said openings are defined by mutually orthogonal sets of parallel wires, the wires in each of said sets being spaced apart approximately 1/32 of an inch.

10. The improvement of claim 8, wherein said grid is defined by a stainless steel screen.

11. The improvement of claim 8, wherein said grid is spaced below said flue top between approximately $\frac{1}{4}$ to $\frac{1}{2}$ inches.

12. A method of applying liquid soldering flux to the face of a printed circuit board or the like, comprising the steps of:

passing said board over the top of a flue;

generating a foam of liquid flux bubbles within said flue;

flowing said bubbles upwardly through the top of said flue and into contact with said face of said board, there being present larger bubbles adjacent said face of said board; and, breaking said larger bubbles into smaller bubbles by placing a screen across said flue and closely spaced below the top of said flue, the upwardly flowing bubbles being passed through said screen, said board face forcing said larger bubbles downwardly into bursting contact with said screen.

13. The method of claim 12, including the step of positioning said screen at successively higher positions within said flue until said screen converts the upwardly flowing bubbles into liquid, and then lowering said screen in said flue a prescribed distance.

* * * * *